United States Patent [19]

Bobeck

[11] 4,228,523
[45] Oct. 14, 1980

[54] CONDUCTOR ACCESS BUBBLE MEMORY ARRANGEMENT

[75] Inventor: Andrew H. Bobeck, Chatham, N.J.

[73] Assignee: Bell Telephone Laboratories, Incorporated, Murray Hill, N.J.

[21] Appl. No.: 18,454

[22] Filed: Mar. 8, 1979

[51] Int. Cl.² ............................................. G11C 19/08
[52] U.S. Cl. .......................................... 365/19; 365/20
[58] Field of Search ............................... 365/19, 20, 21

[56] References Cited

U.S. PATENT DOCUMENTS

| 3,693,177 | 9/1972 | Owens | 365/20 |
| 4,064,496 | 12/1977 | Myer | 365/19 |

Primary Examiner—Vincent P. Canney
Attorney, Agent, or Firm—Herbert M. Shapiro

[57] ABSTRACT

Continuous film type, current-access bubble memories are designed for low power operation by including, along the current paths, areas of reduced width. The areas of reduced widths are characterized by relatively high current densities, which are preferred, for example, for expansion detected or operation, without an increase in power consumption.

10 Claims, 6 Drawing Figures

CONDUCTOR ACCESS BUBBLE MEMORY ARRANGEMENT

FIELD OF THE INVENTION

This invention relates to magnetic bubble memories and more particularly to such memories of the conductor access type.

BACKGROUND OF THE INVENTION

A particularly attractive magnetic bubble memory of the conductor access type is disclosed in my copending application Ser. No. 914,959 filed June 12, 1978. In memories of the type disclosed therein, the movement of magnetic bubbles in a suitable host layer of material is achieved in response to a sequence of current pulses impressed in first and second electrically-conducting layers adjacent the bubble layer. The electrically-conducting layers are separated by an electrically-insulating layer and include like patterns of apertures one pattern offset with respect to the other. The apertures respond to the current pulses to produce successive patterns of magnetic field gradients which move bubble patterns along paths defined by the patterns of apertures.

In a typical memory organization, the paths are arranged in closed loops between which bubble patterns are transferred during operation. The loops are arranged in parallel to recirculate bubbles in what are commonly referred to as minor loops. When a particular address is selected, a bubble patterns is moved into an accessing loop termed a major loop operative to move bubbles to a detector. A bubble generator also couples the major loop to create a replacement bubble pattern for transfer into a selected address. All operations, write, read, transfer and propagation are synchronized to a sequence of propagation pulses derived from a master clock. One skilled in the art will recognize the operation as typical of major-minor bubble memories as described in U.S. Pat. No. 3,618,054 issued Nov. 2, 1971 to P. I. Bonyhard, U. F. Gianola and A. J. Perneski.

Conductor access memories of the type described above do not require increasing amounts of power as the increasingly higher frequencies are realized. But, a number of current reducing techniques are being employed to improve the efficiency of the chip and drive-electronics. For example, new material systems exhibit surprisingly high mobilities, low coercivities and virtually zero magnetostriction. Such materials are very attractive for realizing practical conductor access memories. Also, conductor layer partitioning allows separate operation of major and minor loops leading to a low duty cycle and thus low power requirements.

BRIEF DESCRIPTION OF THE INVENTION

The present invention is based on the recognition that different functional areas of a dual-conductor, bubble memory chip exhibit optimum performance at different current densities. Consequently, it was realized that the problem of reducing power requirements for a conductor-access memory could be met if the conductor layers could be configured to provide distinct large areas in which the overall current densities are different. We will adapt the convention that apertures in the conductor layers respond to an impressed current to generate a localized field gradient over a relatively small area. A "large" area over which current densities are different is one in which large numbers of the relatively small areas are located. In one embodiment, the bulk of the chip in which bubble propagation occurs is at one current density and the remaining area in which an expander-detector arrangement is located is at a second current density. Significantly, bubble propagation occurs with wide margins in each of areas of quite different current densities in a single chip.

Thus, in accordance with one embodiment of this invention, a bubble memory comprises a host layer in which bubbles can be moved and means for moving bubbles in the layer along at least first and second paths, the means comprising at least a first layer of electrically conducting material including a pattern of apertures each aperture being adapted to provide field gradients locally in a small area for moving bubbles thereabout in response to currents impressed therein, the first layer being of a geometry to exhibit at least first and second current densities in first and second areas large compared to the small areas in response to the currents.

The areas of different current densities are separated by a transition region in which the conducting layers include a partial sunburst pattern of slots spaced further from one another at one end than at the other. The slots function as a transformer and introduce an anisotropy into what may otherwise comprise an uniform, conducting layer. Thus, an electrically-conducting layer herein is characterized by a plurality of slots which converge at one end to define a current path large at one end and relatively small at the other for ensuring an increased current density in the area at that other end for a given current impressed therealong. The areas of different current densities are thus electrically in series; they need not be aligned along a given axis of the host layer.

DETAILED DESCRIPTION

Figure 1:
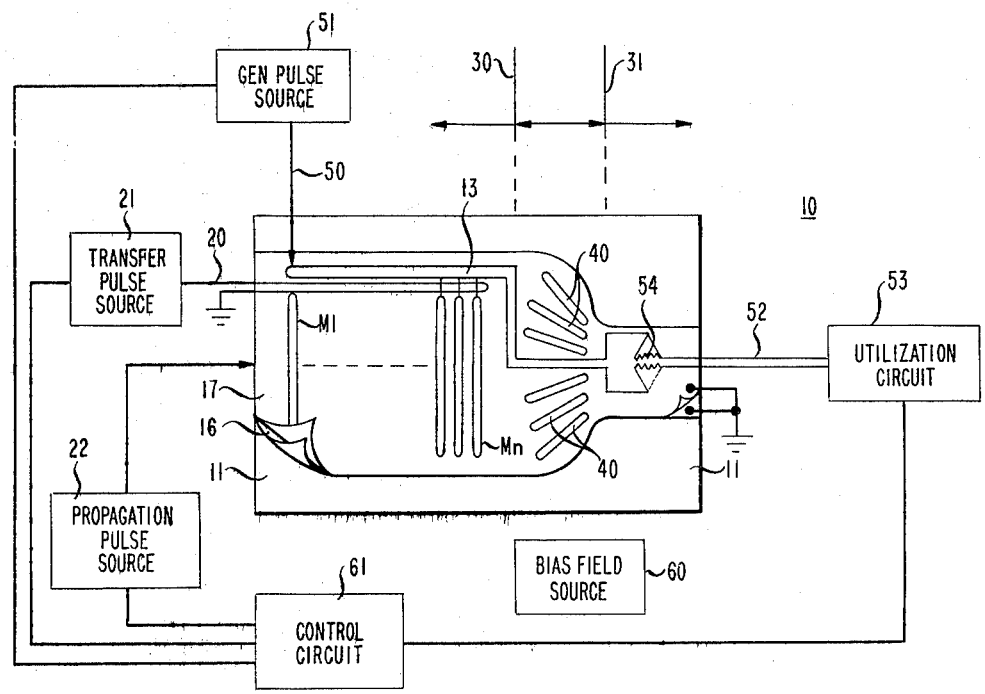
FIG. 1 shows a block diagram of a magnetic bubble memory in accordance with an embodiment of this invention.

FIG. 1 shows a block diagram of a magnetic bubble memory 10 in accordance with this invention. The memory comprises a host layer 11 in which magnetic bubbles can be moved. Typically layer 11 comprises a single crystal garnet film grown epitaxially on a non-magnetic garnet substrate (not shown) in accordance with well understood techniques. Alternatively, an amorphous film is known to have use as a host layer for bubbles.

Magnetic bubbles are moved in layer 11 along paths represented by closed lines $M_1 \ldots M_N$ and 13 in the figure. These paths may be understood to indicate the familiar major-minor organization with loop 13 representing the major loop.

Bubble propagation herein occurs in response to current pulses impressed in two electrically-conducting layers 16 and 17 as disclosed in my above-mentioned patent application. Movement of bubble patterns to and from the minor loops is controlled, for example, by a transfer implementation of the type disclosed in my copending application Ser. No. 14,606, filed 2-23-79. The transfer operation is under the control of a control conductor 20 shown connected between a transfer pulse source 21 and ground. Layers 16 and 17 are separated by an electrically insulating film, not shown, which typically comprises a 1500 to 2000 Angstrom unit thick layer of silicon dioxide.

Figure 2:
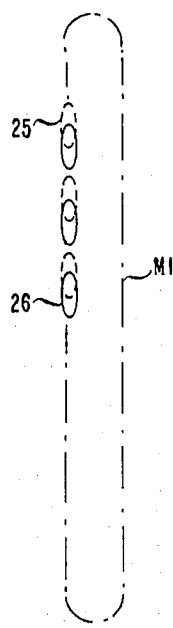
FIGS. 2 and 3 show enlarged top views of portions of the memory of FIG. 1.

The actual paths of bubble movement in layer 11 are defined by apertures or other localized modifications of the impedance in layers 16 and 17 to generate localized magnetic field gradients in response to current pulses impressed in the layers from the left as viewed in the figure. To this end, each of layers 16 and 17 is connected between a propagation (here current) pulse source 22 and ground as shown. Representative apertures are shown enlarged in FIG. 2 as broken ovals 25 and closed ovals 26 to represent apertures in layers 16 and 17 of FIG. 1 respectively. Each of these apertures can be seen to occupy only a minute area of one of layers 16 and 17 and can be seen to be organized in considerable numbers of above one hundred apertures in each layer to define say one minor loop such as loop $M_1$.

According to the present invention, the electrically-conducting layers are contoured on a gross scale which is large compared to the area occupied by an aperture 25 or 26. This can be seen in FIG. 1 where layers 16 and 17 are shown as having a reducing width between broken, imaginery, vertical lines 30 and 31. To the left of line 30, as viewed, layers 16 and 17 have widths (vertical dimensions) actually coextensive with layer 11 although depicted as less for illustrative purposes. To the right of line 31 on the other hand, the vertical dimension of the layers is relatively small but still on a gross scale large compared to an aperture 25 or 26.

The transition region between lines 30 and 31 is characterized by apertures 40 which penetrate through both of layers 16 and 17. It is to be understood that the relatively wide area of the conducting layers, the transition region and the relatively narrow area of the conducting layers are connected electrically in series between pulse source 22 and ground. Apertures 40 are operative, as a transformer, separating areas of low and relatively high current densities.

Major loop 13 can be seen to define a path which traverses the two areas of high and low current densities as well as the transition region. The path is operative to move bubbles to and from the minor loops in the low current density area and to and from a detector in the high current density area. It is to be noted that a generator and the detector arrangement are positioned in the low and high current density area while the major loop propagation implementation passes through both these areas and the transition or region area. In this connection, a bubble generator is represented by arrow 50 connected to a generator pulse source 51. A bubble detector is represented by line 52 connected to a utilization circuit 53. The arrangement includes a detector element 54 in an expander-detector arrangement operative to first expand and then contract bubbles from and to a nominal operating bubble diameter as shown, for example, U.S. Pat. No. 3,713,120 of A. H. Bobeck, F. J. Ciak and W. Strauss, issued Jan. 23, 1973. Bubbles are maintained at the nominal diameter by a bias source represented by block 60 in FIG. 1.

The various sources and circuits herein operate under the control of a control circuit 61 and may comprise any such elements capable of operating in accordance with this invention.

Figure 3:
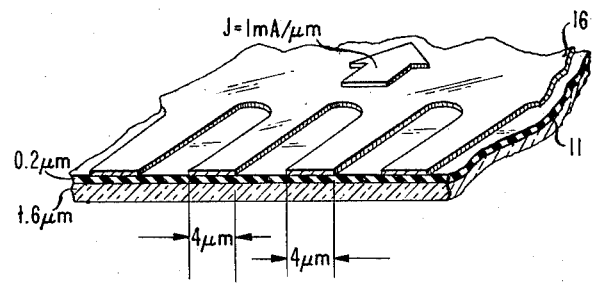

FIG. 3 shows, enlarged, the right edge portion of the memory of FIG. 1 in which current pulses are impressed. The figure shows host layer 11 and conducting layer 16 separated by an electrically insulating layer. Layer 11 and the insulating layer are shown as having thicknesses of 1.6 microns ($\mu$m) and 0.2 microns respectively. Layer 16 has a thickness of 0.4 microns and is shown as having 4.0 micron slots. The layer exhibits a sheet current density of 4 ma/$\mu$m and thus a strip current density of 8 ma/$\mu$m.

Figure 4:
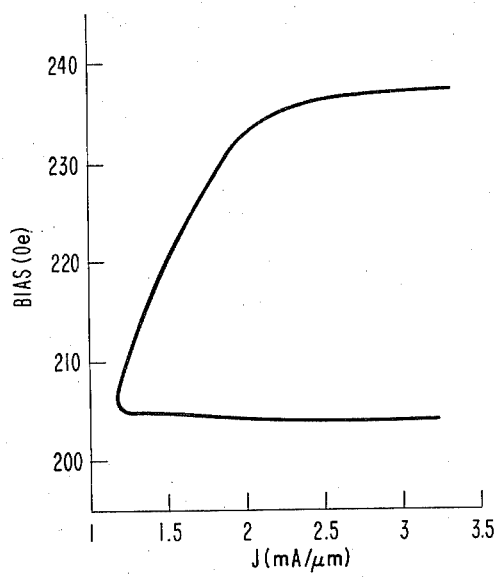
FIGS. 4 and 5 are diagrams of the operating margins for the memory of FIG. 1.
Figure 5:
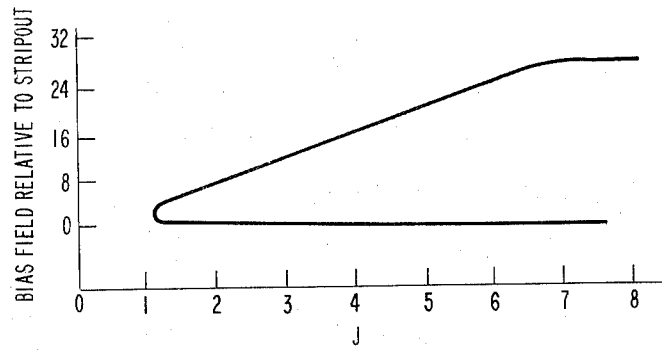

FIGS. 4 and 5 show the margins for propagation and for detector operations where the ordinate is in oersteds of bias from source 60 of FIG. 1 and the abscissa is current density J. It is to be recognized that the curve corresponds to each of layers 16 and 17 in FIG. 1. Wide propagation margins are achieved in areas characterized by substantial differences in current density. Thus, major loop 13 occupies a position in areas of substantially different current densities without significant degradation of operating margin. Of course, because of a desire to operate with the lowest possible power requirements, propagation should occur mostly in areas of low current density.

On the other hand, detection provides the widest operating margins at relatively high current densities. This is clear from FIG. 5 where the ordinate, although in terms of bias field value, is normalized to the strip out field at which the familiar expander-detector is first operative, a current density greater than four is desired whereas propagation can occur at current densities of less than two. Clearly, it is advantageous to reduce the width of the current path in layers 16 and 17 where the expander-detector is defined to achieve higher current density without an increase in the chip power requirements. It is fortuitous that propagation margins are sufficiently alike in areas of different current densities to allow for a major loop to move bubble patterns in such unlike areas.

Figure 6:
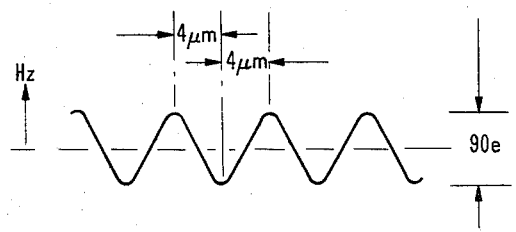
FIG. 6 is a pulse form of a current impressed for driving the memory of FIG. 1.

The contribution of the higher current density to the detection operation is to produce stronger field gradients in the detector arrangement at the apertures which cause bubble expansion. Thus, source 22 of FIG. 1 may impress current pulses to generate field gradients of say nine oersteds in one of layers 16 or 17, as shown in FIG. 6, but twenty oersteds are typically necessary for bubble expansion. By placing the detector in an area of layer 11 coupled by areas of layers 16 and 17 which have reduced widths, with respect to the current path, the resulting current density increase in the area of reduced width provides for the increase field gradient strength.

Impedance matching considerations dictate that layer 11 be rectangular rather than square. That is to say, the width of the current path should be narrower than the length to achieve an efficient structure. On the other hand, the current path can be folded to achieve a square geometry or, sets of minor loops can be arranged symmetrically about the major loop to achieve a relatively square overall geometry either along with or instead of folding the current path. A symmetrical arrangement has the added advantage of minimizing a field component normal to layer 11 which occurs at the major loop when the loop is adjacent on edge of layer 11. This field is evident particularly when layers 16 and 17 are partitioned to allow driving of portions of the layers separately. As the current path can be folded to achieve some geometric advantage, so can the areas of different current densities be arranged in those folds. So, for example, the area to the right of line 31 in FIG. 1 can be rotated 90 degrees with only negligible change in operating margins.

Memories of the type shown in FIG. 1 have been operated at above one megahertz. Bubbles having nominal diameters of 1.6 microns have been moved with aperture patterns of the type shown in FIG. 2 having a period of four, six, or eight oersteds. Operation consistent with the margins shown in FIGS. 4 and 5 was achieved with propagation (drive) pulses as shown in FIG. 6. Operation is achieved with power dissipation approaching one microwatt per bit.

What has been described is considered merely illustrative of the principles of this invention. Therefore, various modification can be devised by those skilled in the art within the spirit and scope of this invention as encompassed by the following claims.

I claim:

1. A magnetic bubble memory comprising a host layer (11) of a material in which magnetic bubbles can be moved, and means (16,17,$M_1 \ldots M_N$,13,22) for moving magnetic bubbles in the layer, the means comprising at least one continuous layer (16) of electrically-conducting material for providing a current path for pulses (see FIG. 3) impressed therein and means ($M_1 \ldots M_N$ and 13) for defining a periodic pattern of magnetic field gradients in response to the pulses, the memory being characterized in that the overall width of the current path is sufficiently different in at least first and second areas (to the left of line 30 and to the right of line 31 in FIG. 1) to provide substantially different current densities in response to each of the current pulses.

2. A magnetic bubble memory in accordance with claim 1 also including a second layer of electrically-conducting material, said second layer also having areas of different widths corresponding to the areas of different widths of said first layer.

3. A magnetic bubble memory in accordance with claim 2 wherein said first and second areas of each of said layer of electrically conducting material are separated by a transition area in which current density changes from a low to a relatively high level in response to said current pulses.

4. A magnetic bubble memory in accordance with claim 3 wherein said means for moving magnetic bubbles comprises associated patterns of apertures in said first and second layers for generating changing patterns of localized field gradients in response to said current pulses.

5. A magnetic bubble memory in acordance with claim 4 wherein said patterns of apertures defined closed-loop paths for circulating bubbles thereabout, wherein at least one of said closed path is a major loop operative to move bubbles in said first and second areas and said transition area.

6. A magnetic bubble memory in accordance with claim 5 wherein said major loop includes an expander-detector arrangement in said second area of relatively high current density.

7. A magnetic bubble memory in accordance with claim 6 wherein said major loop also includes a generator in said first area of relatively low current density.

8. A magnetic bubble memory in accordance with claim 7 wherein the remaining ones of said closed loops define minor loop and are positioned in said first area of relatively low current density.

9. A magnetic bubble memory in accordance with claim 8 also including means for controllably moving bubble patterns between said major and said minor paths in said first area of relatively low current density.

10. A magnetic bubble memory comprising a host layer of a material in which magnetic bubbles can be moved, and at least a first layer of electrically-conducting material coupled to said host layer and adapted for providing a current path in said first layer, said first layer including therein an area in which the width of said current path is reduced from relatively wide to narrow, said area including apertures arranged in a partial sunburst pattern having ends relatively close together where said current path is narrow.

* * * * *